US005434129A

United States Patent [19]

Motowidlo et al.

[11] Patent Number: 5,434,129

[45] Date of Patent: Jul. 18, 1995

[54] METHOD FOR MANUFACTURING HIGH TC SUPERCONDUCTOR COILS

[75] Inventors: Leszek Motowidlo, Bristol, Conn.; Pradeep Haldar, Guilderland, N.Y.

[73] Assignee: Advanced Superconductors, Inc., Waterbury, Conn.

[21] Appl. No.: 126,171

[22] Filed: Sep. 23, 1993

[51] Int. Cl.[6] .......................... H01L 39/24; H01F 6/06

[52] U.S. Cl. .................................... 505/433; 505/430; 505/230; 505/704; 29/599; 427/62; 174/125.1

[58] Field of Search ............... 505/430, 433, 704, 230; 427/62; 29/599, 605; 174/125.1

[56] References Cited

U.S. PATENT DOCUMENTS 4,906,609 3/1990 Yamauchi .

FOREIGN PATENT DOCUMENTS 1-183102 7/1989 Japan .

OTHER PUBLICATIONS

Flukiger, R. et al. "The Deformation of Bi(223) Tapes By Hot Rolling," *Materials Issues in High-Temperature Superconductivity* Spring Symposium, Apr. 12-16, 1993, p. 386.

Haldar, P. et al., "Enhancement in Critical Current Density of Bi-Pb-Sr-Ca-Cu-O Tapes By Thermomechanical Processing; Cold Rolling Versus Uniaxial Pressing" *Applied Physics Letters* vol. 60. No. 4, Jan. 1992 pp. 495-497.

Shibuta N. et al. "Transport Critical Current Properties of Silver-sheathed Bi-Based Supercondcuting Tapes and Coils at 4.2 D." *Japanese Journal of Applied Physics*, vol. 30, No. 12B, Dec. 1991, pp. L2083-L2084.

*Primary Examiner*—Roy V. King
*Attorney, Agent, or Firm*—Helfgott & Karas

[57] ABSTRACT

A method of producing a high temperature long length coil of superconductor wire is disclosed. The method utilizes the "powder-in-tube" method or a similar method to form a wire. The wire is then shaped into rectangular form and wound around a mandrell. Rings, having a gap exposing the superconductor inside the silver or silver alloy tube are formed by cutting the wound wire and the rings are pressed to their final thickness. Each ring is then coated with an insulator and filed on both an outer side of one end of the gap and on an inner side of the other end of the gap. The rings are then positioned adjacent one another such that the gaps are staggered. They are placed in a manner in which the exposed superconductor on an outer side of one ring is in contact with the exposed superconductor on the inner side of an adjacent ring. The rings are then clamped together and heated to merge the superconducting material by diffusion. A long length coil is thus formed from the rings that are clamped.

13 Claims, 6 Drawing Sheets

METHOD FOR MANUFACTURING HIGH TC SUPERCONDUCTOR COILS

BACKGROUND OF THE INVENTION

1. Field of the Invention

The present invention relates generally to superconductor materials formed from powdered metal oxides and, more particularly, to a method for producing long length high temperature superconductor coils.

2. Description of the Prior Art

Superconductor wires have, for many years, been fabricated according to a conventional technique known as the "powder-in-tube" method. One example of such method is described in U.S. Pat. No. 4,906,609 and illustrated in FIG. 2. Typically, the method involves utilizing initial starting materials and providing for a series of grinding and heat treatment operations to produce a powdered mixture which is then packed into the silver tube. Thereafter, a series of cold working operations including drawing and rolling are performed to thereby provide a desired thickness of the wire. An intermediate heat treatment is introduced followed by rolling to final thickness and thereafter, annealing. The wire is then formed into a magnet coil and the final heat treatment operation is performed on the magnet coil.

A number of problems have been found with the final magnet coil thus produced. One problem relates to the introduction of microcracks. Generally, such cracks are introduced during the rolling operations while producing the final thickness. For example, we have found that the critical current density (Jc) when pressed and heat treated repeatedly will show improvement as a function of time. However, under similar conditions of temperature and time the Jc for repeated rolling/heat treatments does not show improvements. In contrast, the Jc decreases as the rolling steps increase. The graph of FIG. 1 illustrates the differences achieved when pressing as opposed to rolling with respect to total heat treatment time. The plot of the two pressing samples illustrate results obtained when pressing at a pressure of 18 Kbar and at varied pressures. The plot of the two rolling samples illustrate results obtained when rolling operations are performed two and three times. During the rolling operations we find an increased development of microcracks. This is a consequence of the non-uniform application of stresses from the rolls. The enhancement of the critical current density by using uniaxial pressing instead of cold rolling, to produce the final thickness of the wire, prior to annealing is disclosed in Applied Physics Letters, Volume 60, Number 4, Jan. 27, 1992 pages 495–497.

At present in the fabrication of long lengths of monocore HTS tape conductors, critical current density (Jc) properties are substantially lower than what may be obtained in short pressed samples. For example, the best critical current density at liquid nitrogen temperatures (77K) is nearly 70,000 A/cm$^2$ in Zero field obtained in short pressed BSCCO tapes. However, such high current densities have not been achievable in long length commercial coils. One of the main reasons for the marked differences in Jc properties for short pressed verses longer rolled tapes comes from the fact that the short pressed samples undergo a uniform or uniaxial stress whereas for rolling the stress is non-uniaxial. Consequently, non-uniform stresses may introduce microcracks which may not be completely annealed out. Since density and texture are important to promoting optimum electrical properties, fabrication by rolling of long lengths of HTS tape may severely limit the Jc properties available and therefore eliminate applications with high field requirements at higher temperatures. Properties obtained by pressing or rolling very short lengths of wire can be seen from the Japanese Journal of Applied Physics, Volume 30, Number 12B, December, 1991, pages L2083–L2084. In the method used in this paper, coils of very short lengths were used to obtain the Jc's reported. Using greater than very short lengths would not be practical for pressing, in that, variations in thickness or severe discontinuities would be induced. To fabricate long lengths of HTS tapes with the high Jc's obtained through the method of pressing has heretofore, not been possible.

It has also been suggested to deform Bi-2223 tapes by hot rolling. Such was introduced by R. Flukiger, A. Perin and E. Walker from the Universite de Geneve in Switzerland at the Materials issues in High Temperature Superconductivity Spring Symposium T on Apr. 12–16, 1993. A deformation technique was developed to enhance the degree of texturing as well as the density by hot rolling. A prototype rolling machine was constructed with rolls of 80 mm diameter that can be heated up to 800° C. Various problems were encountered, each requiring separate solutions. The most important are: a) the flow of the Ag sheath at elevated temperatures leads to enhanced sausaging, b) sticking of the Ag sheath to the heated rolls, and c) the precise determination of the tape temperature between the two rolls.

While there is continued progress at providing increased critical current densities for high Tc superconductor materials, further improvements are still needed. Furthermore, when providing long length coils of such wire, the severe discontinuities and microcracks introduced into the high Tc materials using the currently known methods continue to detract from the improved current densities needed in such materials.

The present invention introduces a method of coil fabrication which departs from the normally accepted methods of producing long length superconductor wires, avoids the problems encountered in producing long length superconductors and exploits the ideal conditions obtained by known methods.

SUMMARY OF THE INVENTION

It is, accordingly, an object of the present invention to produce long length high Tc superconductor coils using a method which departs from the presently known and accepted methods.

It is another object of the present invention to produce long lengths of high Tc superconductor coils having properties only previously obtainable with very short length high Tc superconductor coils.

A further object of the present invention is to improve the flux pinning of long length high Tc superconductor coils.

A still further object of the present invention is to produce long length high Tc superconductor coils without introducing variations in thickness.

Another object of the present invention is to eliminate the step of rolling and, thus, not allow for the inducement of numerous microcracks formed by such a step.

A still further object of the present invention is to produce such long length high Tc superconductor coils from short length rings.

Accordingly, the present invention relates to a method of producing long length high temperature superconductor coils having greater critical current densities than coils produced using previous methods. This method departs from the generally known and accepted methods of producing such superconducting coils. The present invention is able to combine numerous short length high Tc superconductor coils having very large Jc's and forming a long length high Tc superconductor coil with comparable Jc's.

The method comprises the steps of producing the superconductor wire using the "powder-in-tube" method. The wire is then shaped into a form having intermediate rectangular dimensions, wrapped around a mandrell, and cut into rings of equal diameter. The rings each have a gap, because of the fact that they were cut from a longer length coil, and thus have a shape similar to the letter "C". Pressing of each entire ring individually is then performed. After the pressing, there can be provided an additional step of annealing. The process of pressing, followed by annealing, can be repeated thereafter, until the final thickness of the rings is achieved. The annealing may also be performed concurrently with the pressing to obtain the final thickness of the rings.

Each ring is then brushed with an insulting material. One end of each ring, abutting the gap, is filed on an outer side and the opposite end of the ring is filed on an inner side to expose the superconductive material. The rings are then lined up adjacent to each other having their gaps staggered to form a coil of rings, the filed outer side end of each ring is placed in contact with the filed inner side end of the adjacent ring. A clamp is then placed on each end of the coil of rings and clamped together by bolts. The rings are then heat treated so they may merge together at their exposed superconductive ends by diffusion of the two superconductors.

The final product produced, a long length coil of high temperature superconductor, provides improved texture and density along with greatly improved flux pinning. Therefore, based on the improved texture, density and flux pinning an improved overall Jc, not previously obtainable in long length high Tc superconductor coils, using other methods of production, results. The improved Jc obtained is of a value comparable to those obtained in short pressed samples.

The aforementioned objects, features and advantages of the invention will, in part, become obvious from the following more detailed description of the invention, taken in conjunction with the accompanying drawings, which form an integral part thereof.

DESCRIPTION OF THE PREFERRED EMBODIMENT

Figure 1:
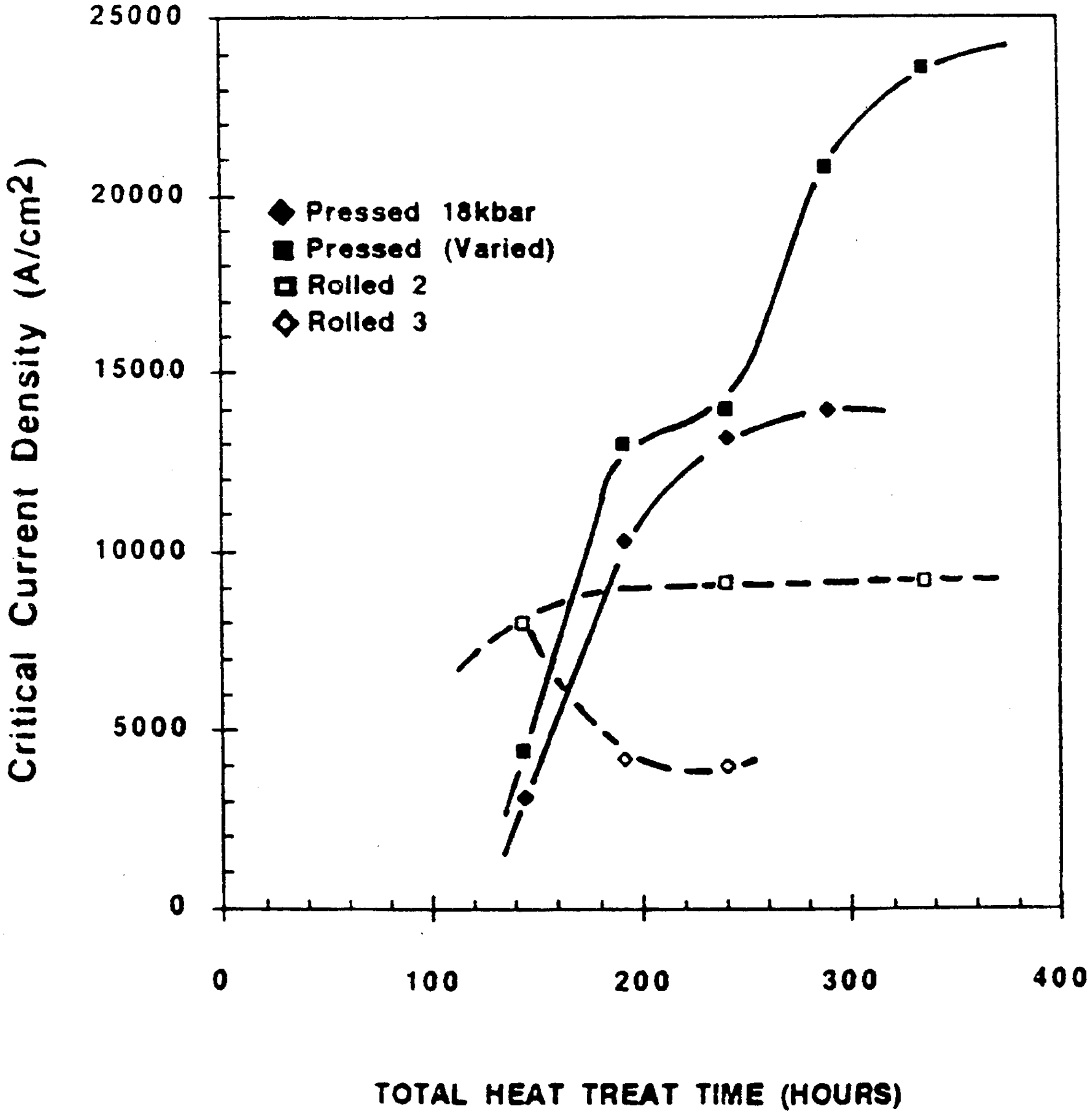
FIG. 1 is a graph showing the critical current density verses the heat treatment for both rolling and pressing to obtain final thickness.
Figure 2A:
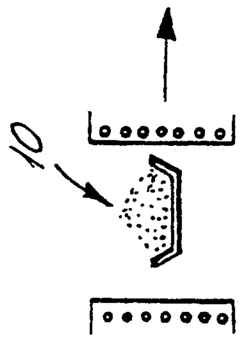
FIGS. 2A, 2B, 2C and 2D illustrate the steps used in the "powder-in-tube" method and the shaping step used to obtain a wire of intermediate rectangular dimensions.
Figure 2B:
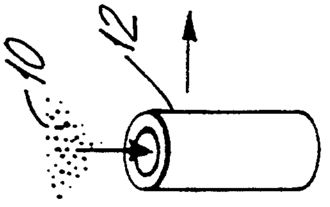
Figure 2C:
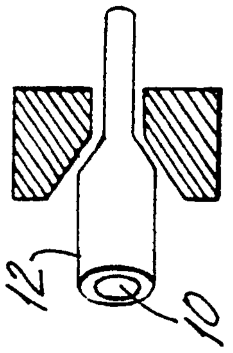
Figure 2D:
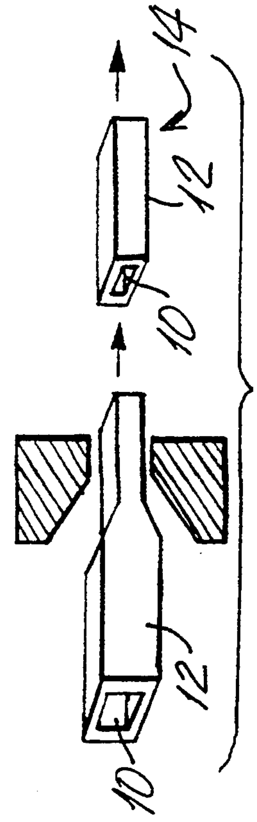

Referring now to the drawings, in FIG. 2 there is shown the method of forming a wire by the "powder-in-tube" method for use in the present invention.

A precursor powder 10 is produced from any material having the properties necessary for use as a high temperature superconductor (HTS). By way of example, such properties include very low resistance, high transition temperatures and high critical fields. The powder 10 is formed by any known method, such as repeatedly heat treating and grinding, until it is of an appropriate thickness and diameter. The powder 10 is then introduced into a silver or silver alloy tube 12, as seen in step B of FIG. 2, and processed according to the "powder-in-tube' (PIT) method, see steps B and C of FIG. 2. The composite billet, formed from the "powder-in-tube" method, is then drawn and shaped into its final form of intermediate rectangular dimensions 14, see step D of FIG. 2.

Figure 3:
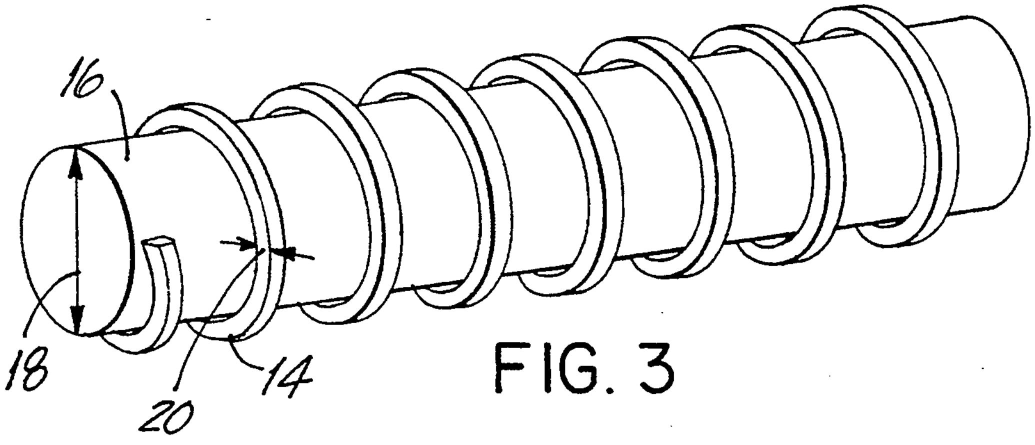
FIG. 3 is a perspective view of the wire wrapped around the mandrell.

Once a wire 14 of intermediate rectangular dimensions is formed, the wire 14 is bent around a cylindrical barrel or mandrell 16 of a certain diameter 18 to form a coil also illustrated by the number 14 in FIG. 3. It is bent so that the longer sides 20 of the rectangular shape are perpendicular to the barrel or mandrell 16. The length, width and thickness of the wire 14 at the intermediate dimensions are such that bending of the wire 14 around the barrel or mandrell 16 are feasible without any heat treatments.

Figure 4:
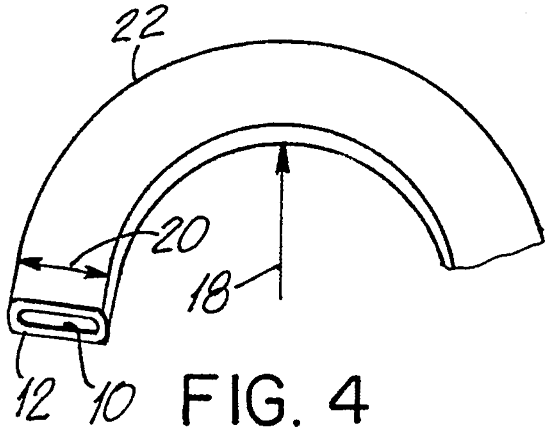
FIG. 4 illustrates a section of ring after being wrapped around a mandrell and cut.
Figure 5:
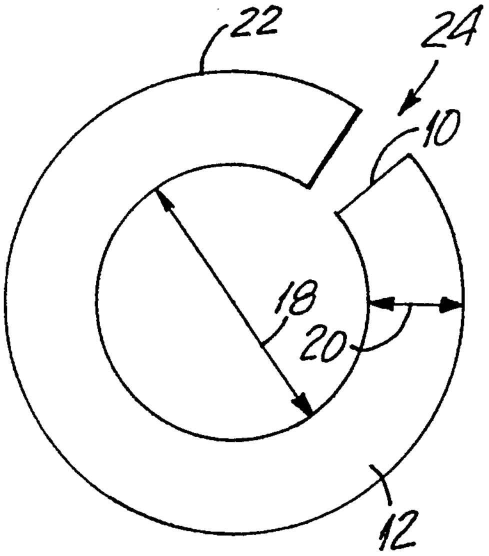
FIG. 5 is an elevational view of a ring of superconductive material.

The coil 14 is then cut into rings 22, see FIGS. 4 and 5. The rings have a diameter 18 equal to that of the barrel 16. Each ring 22 formed will have a gap 24 and thus is shaped substantially in the form of the letter "C". The gap 24 is formed in each ring 22 because the rings 22 were cut from a long coil 14. The ends of the gaps 26 and 30 are the points at which the coil 14 was cut. On either side of the gap 24, the superconductor material 10, within the silver or silver alloy tube 12, is exposed, see FIG. 4. Each ring 22 is now individually pressed and heat treated until the desired thickness and width is obtained. The entire ring 22 is pressed at one time. The pressing and heat treating may be performed in separate sequential steps or concurrently. If performed in sequential steps, the steps are repeated until the ring 22 is of the desired thickness and width. If performed concurrently the ring 22 is pressed at an elevated temperature for an interval which is repeated until the final thickness and width is obtainted. The temperature range for heating either intermittently or concurrently with pressing is between 800°–840° C.

The pressing step serves to improve the properties of the superconductor by improving the texture and density of the superconductor, and lining up the flux pinning centers. The improvement of these properties serves to increase the overall Jc of the superconductor while also obtaining the final overall tape thickness.

With regards to improving the flux pinning sites, when the temperature is raised to a value greater than or equal to 800° C. either during or after pressing, then the ceramic will become ductile and respond more plastically. This allows dislocations to be introduced into the material by pressing without brittle cracking. Dislocations are line defects, essentially a dislocated plane of atoms in the crystal structure. These dislocations are used as new pinning sites for the flux lattice, thus improving the flux pinning.

Once the desired thickness and width is obtained the pressing and heat treatment steps or pressing at elevated temperatures is discontinued. The discontinuance of the pressing steps means the desired density and texture of the rings and, therefore, optimal dimensions and critical current density have been achieved. Rings of the desired dimensions and, thus, critical current density are formed.

The rings are now brushed with a ceramic layer 40. The ceramic layer 40 which is brushed on acts as an insulator. The ceramic which obtains the best known results is zirconium oxide.

Figure 6:
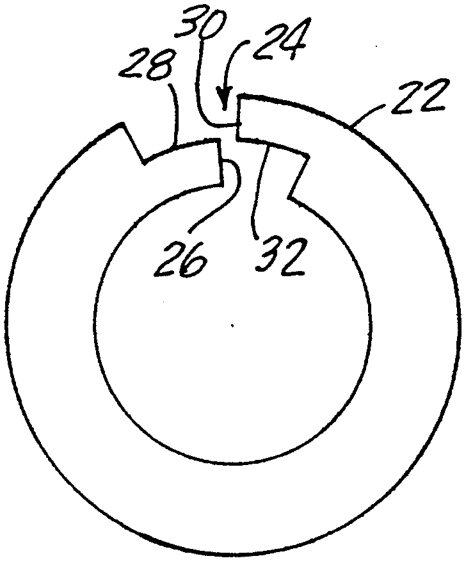
FIG. 6 is a perspective view of a ring after filing.
Figure 7:
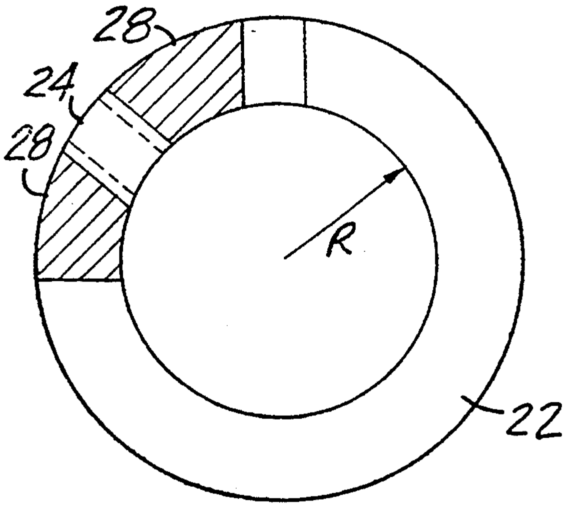
FIG. 7 is a perspective view of two rings adjacent to one another.
Figure 8:
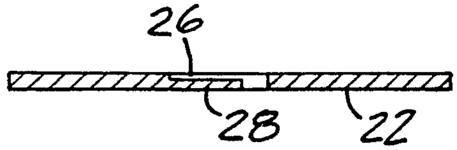
FIG. 8 is a side view illustrating two adjacent rings of FIG. 7.
Figure 9:
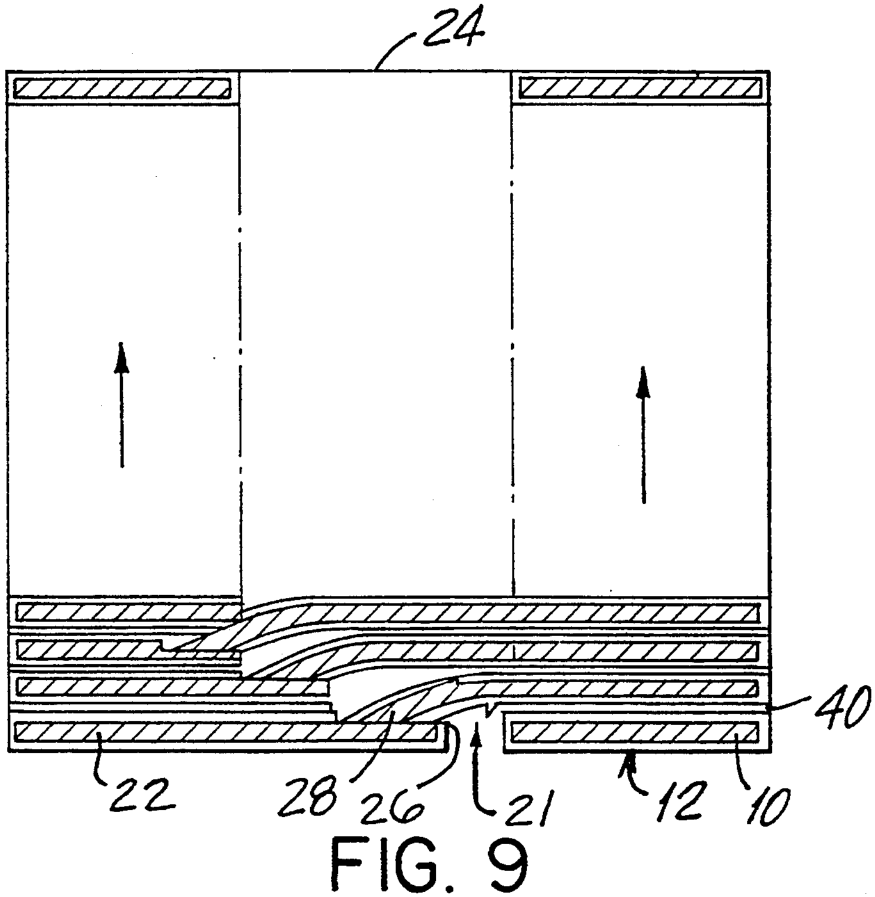
FIG. 9 is a sectional view of a plurality of rings connected at one end to an adjacent ring.

After brushing on the ceramic 40, one of the exposed ends 26 of each ring 22 is mechanically filed or chemically etched on an outer side 28 thereof and the other exposed end 30 of each ring 22 is mechanically filed or chemically etched on an inner side 32 thereof, as seen in FIG. 6. The etching is performed using any known method. This will expose the superconducting material 10 within the silver or silver alloy tube 12. The rings 22 are then lined up alongside one another having their gaps 24 staggered. The gaps 24 of the rings 22 are staggered so that the filed or etched inner side 32 of one ring may come into contact with the filed or etched outer side 28 of an adjacent ring, as can be seen in FIGS. 7–9. When lined up in this manner the rings take the form of a coiled spring. The ends of the rings which are in contact are then clamped together.

Figure 10:
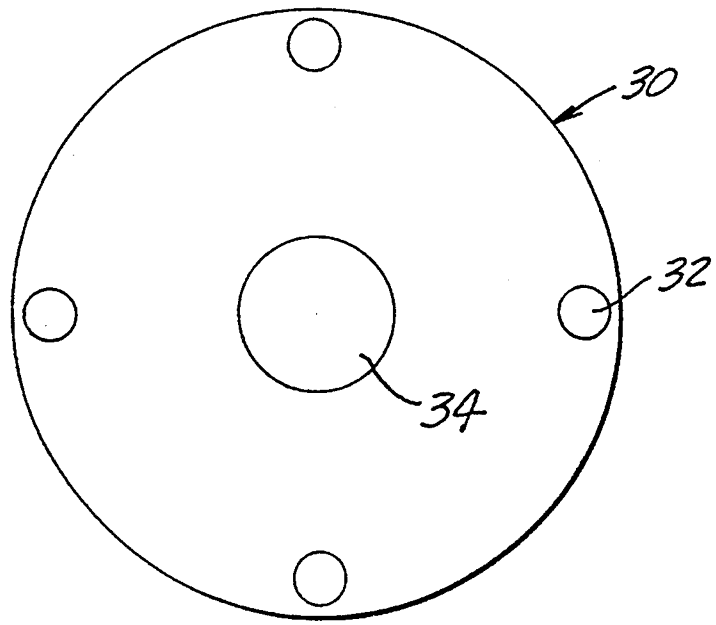
FIG. 10 is a top view of a ceramic flange.
Figure 11:
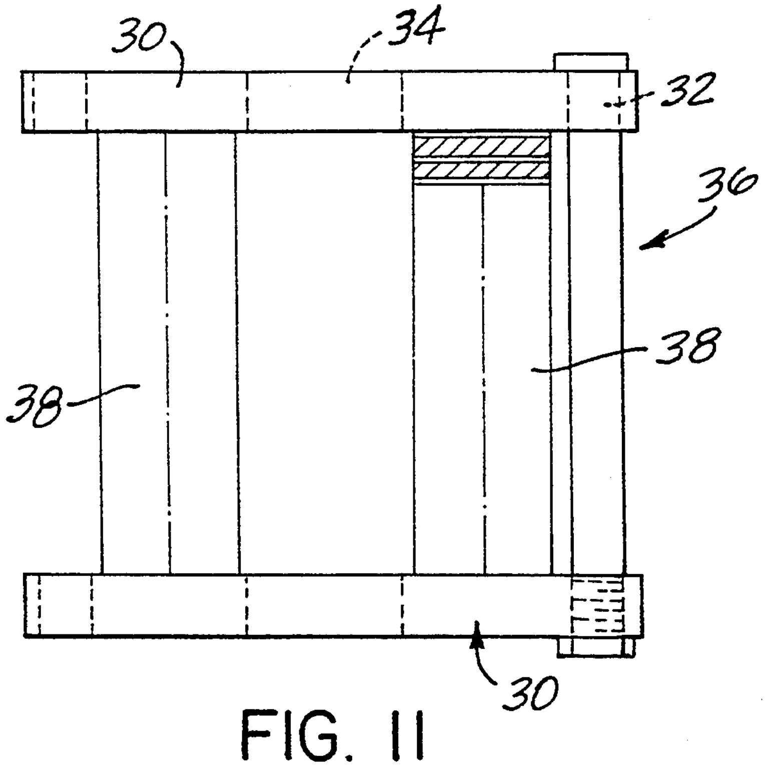
FIG. 11 is a side view of the coil winding clamped together between flanges.

The rings are clamped together by flanges 30, an example of such a flange 30 is illustrated in FIG. 10. A ceramic high temperature material is used to form the flanges 30 so they will not be affected by heat treatments. Around the outer edge of the flange 32 is a number of holes 32 extending therethrough. There is also a hole 34 through the center of the flange 30. A flange 30 is placed on each side of the lined up rings 22 and the flanges 30 are clamped together by bolts 36 placed through the holes 32, as shown in FIG. 11. The length of such a coil 38 would be approximately equal to the length of the bolt 36 used.

Once the rings 22 are clamped together, they are heat treated for 50–100 hours at a temperature in the range of 800°–840° C. The heat treatment is performed to merge the exposed superconducting material 10 on the adjacent rings 22 by diffusion.

Figure 12:
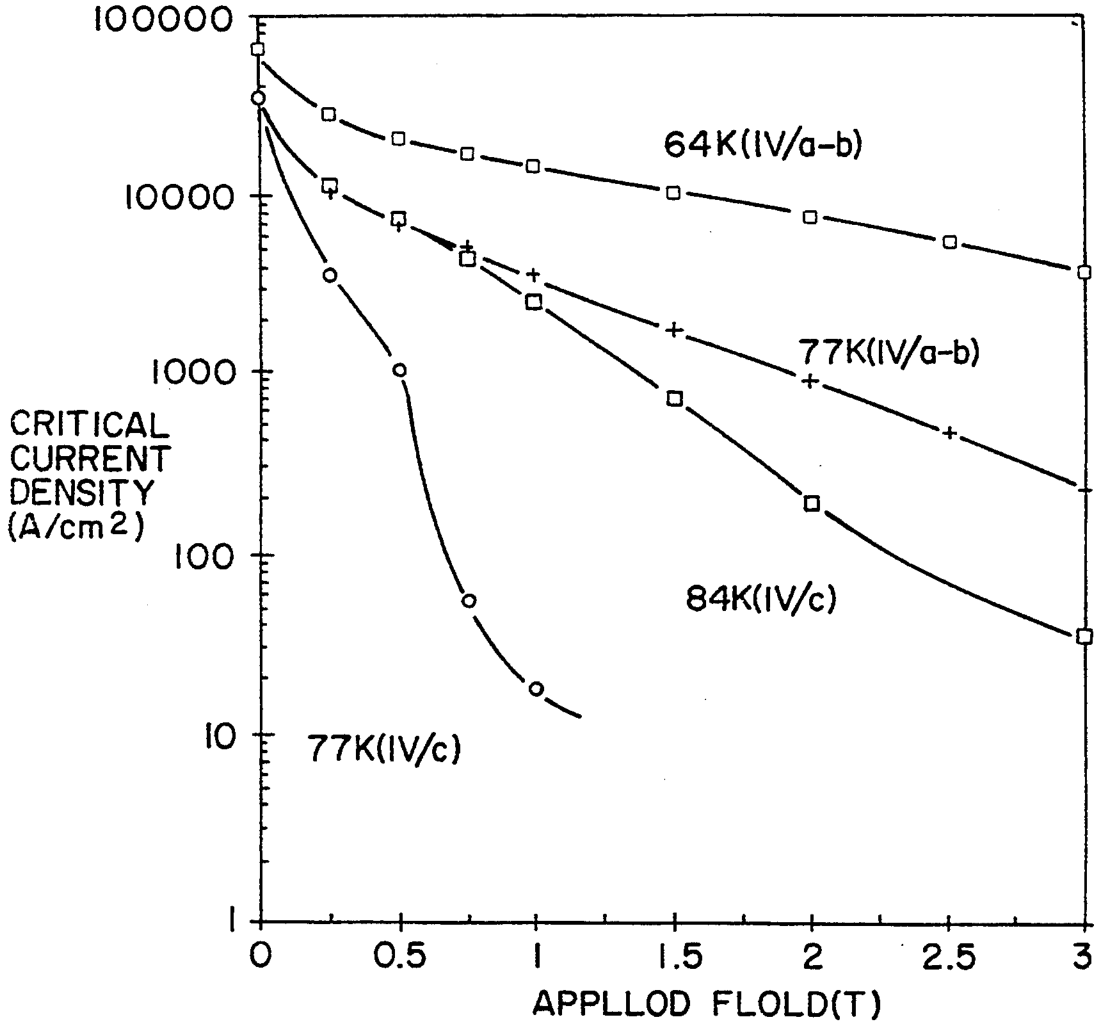
FIG. 12 is a graph plotting the critical current density verses a field applied at different angles of incidence to the wire, the wires being at different temperatures.

As can be seen from FIG. 12, HTS coils fabricated in this manner exploit the highest critical current density properties obtainable by pressing. When the tape conductor is oriented in a manner in which the magnetic field is applied parallel to the a-b plane a best case scenario exists, as can be seen from plots 1 and 2 of FIG. 12. The a-b plane refers to the x-y plane in a cartesian coordinate system. When the magnetic field is applied parallel to the c axis, or z axis in a cartesian coordinate system, a worst case scenario exists, as can be seen from plots 3 and 4 of FIG. 12. Even in this worse case scenario, the critical current properties, in low magnetic fields up to 3 Teslas and temperatures as high as pumped liquid nitrogen (64K), are sufficiently high to be considered applicable as HTS tapes.

The method of the present invention exploits the best known methods presently used to form short length high Tc superconductor wires and, without losing the favorable properties obtained by such methods, is able to combine these short length wires into a long length coil having comparable properties.

There has been disclosed heretofore the best embodiment of the invention presently contemplated. However, it is to be understood that various changes and modifications may be made thereto without departing from the spirit and scope of the invention.

We claim:

1. A method of producing a superconductor coil, comprising the steps of producing a high temperature superconductor wire consisting of a core high temperature superconductor surrounded by a metallic tube; wrapping the superconductor wire around a mandrel to form a coil; cutting the coil into a plurality of rings; pressing the plurality of rings; coating at least a part of each of the plurality of rings with a ceramic layer; filing at least a portion of the ceramic layer of each of the plurality of rings, thereby exposing the core superconductor; placing each of the plurality of rings adjacent to each other such that the exposed superconductor of adjacent rings are in contact and form a coil of rings; clamping the coil of rings together; and heating a temperature within the range of 800°–840° C. to the clamped rings to produce said superconductor coil.

2. The method of claim 1, wherein the high temperature superconductor wire is formed through a series of steps including producing a precursor powder; introducing the precursor powder into one of a silver and silver alloy tube; forming a composite billet; and shaping the billet.

3. The method of claim 1, wherein each of the plurality of rings has first and second opposing ends forming a gap.

4. The method of claim 3, wherein the step of filing includes the steps of filing an outer side of the first opposing end and an inner side of the second opposing end of each of the plurality of rings thereby exposing the core superconductor.

5. The method of claim 4, wherein the step of placing the plurality of rings adjacent to each other includes the steps of staggering the gaps of the plurality of rings and placing the exposed superconductor on the inner side of each of the plurality of rings in contact with the exposed superconductor on the outer side of the adjacent one of the plurality of rings.

6. The method of claim 1, further comprising the step of heat treating the plurality of rings after said step of pressing.

7. The method of claim 6, wherein the step of pressing and step of heat treating are performed repeatedly until the final thickness of the coil is obtained.

8. The method of claim 1, wherein the ceramic layer is made of zirconium oxide.

9. The method of claim 1, wherein the step of shaping produces a wire of intermediate rectangular dimensions having a first and a second pair of sides, the first pair of sides having a larger width than the second pair of sides.

10. The method of claim 9, wherein the wire is wrapped around the mandrell having the first pair of sides perpendicular to the plane of the mandrell.

11. The method of claim 1, wherein the rings are clamped by placing a first flange on a first end of the coil of rings, placing a second flange on a second end of the coil of rings and bolting the first and second flanges together.

12. The method of claim 11, wherein the flanges are made of ceramic high temperature material.

13. The method of claim 1, wherein each ring has an equal diameter.

* * * * *